United States Patent [19]

Vonder et al.

[11] Patent Number: 4,978,912

[45] Date of Patent: Dec. 18, 1990

[54] CHIP CARRIER SOCKET TEST PROBE

[75] Inventors: David L. Vonder, Addison; William A. Reimer, Wheaton, both of Ill.

[73] Assignee: AG Communication Systems Corporation, Phoenix, Ariz.

[21] Appl. No.: 427,278

[22] Filed: Oct. 23, 1989

[51] Int. Cl.⁵ .......................... G01R 1/00; G01R 1/02
[52] U.S. Cl. ................. 324/158 P; 324/72.5; 324/158 F; 439/330
[58] Field of Search .............. 324/158 P, 158 F, 72.5; 439/375, 628, 669, 676, 825–828, 832, 833, 835, 842, 851, 862, 330, 73, 353

[56] References Cited

U.S. PATENT DOCUMENTS

| | | | |
|---|---|---|---|
| 4,012,097 | 3/1977 | Long et al. | 324/158 F |
| 4,055,800 | 10/1977 | Fisk et al. | 324/158 F |
| 4,767,985 | 8/1988 | Shearer, Jr. et al. | 324/158 F |
| 4,768,972 | 9/1988 | Ignasiak et al. | 439/330 |
| 4,835,469 | 5/1989 | Jones et al. | 324/158 P |

FOREIGN PATENT DOCUMENTS 0181806  5/1986  European Pat. Off. ........ 324/158 P

*Primary Examiner*—Reinhard J. Eisenzopf
*Assistant Examiner*—William J. Burns
*Attorney, Agent, or Firm*—Robert J. Black; Gregory G. Hendricks

[57] ABSTRACT

A test probe for use with a chip carrier socket including electrical connections to an external testing device and contacts to engage matching contacts within the chip socket. Tong-like elements grasp the socket to insure both mechanical and electrical integrity of the connections. A slip ring retains the tongs and probe in operated position.

8 Claims, 2 Drawing Sheets

CHIP CARRIER SOCKET TEST PROBE

BACKGROUND OF THE INVENTION

1. Field of the Invention

The present invention pertains to packaged electronic circuitry, and more particularly to a test probe useful for field testing of electronic circuitry associated with so-called chip carriers which are utilized in mounting ceramic and plastic integrated circuit packages.

2. Background Art

The ability to test a circuit, both during manufacture and in field applications, is a very important requirement in electronic technology as currently practiced. In the same field there exists a constant requirement for more dense, faster and cheaper packaging concepts. In many ways, these two requirements contradict each other; that is to say that test point capability usually implies some sort of test access connector with many imput and output connections to electrically access circuit functions both during passive and active modes. Obviously, the supplying of additional connectors for testing purposes adds substantial additional cost to the product, as well as adding additional requirements for space on printed wiring cards, backplanes, etc.

Many electronic circuits today utilize integrated circuits in a so-called dual in-line packaged arrangement (DIP). By removing the dual in-line packaged integrated circuit from an associated socket, the socket then becomes a convenient test access connector. A multi-leader dual in-line package test probe in then capable of being inserted into the socket during testing. After testing is completed, the probe may be removed and the dual in-line packaged integrated circuit is replaced. The present invention anticipates that a similar concept could apply to today's high density chip carriers and chip carrier sockets as frequently utilized in today's technology.

Chip carriers are units designed into products to take advantage of high packaging density and high speed operation. Chip carriers which utilize integrated circuit packages are available in ceramic and plastic packages and in varieties both with and without leads. In most instances there are commercially available chip carrier sockets which are capable of accepting either version.

Typically speaking, chip carriers are cost effective in the 40 to 100 input/output lead range. Below 40 connections, dual in-line packages predominate and above 100 input/output connections pin grid arrays dominate. As many new products require only input/output connections within that 40 to 100 input/output lead range, there use has become quite extensive. Accordingly, a requirement for a test probe for chip carrier sockets appears to the highly desirable, such units being unknown at the present time.

SUMMARY OF THE INVENTION

A chip carrier test probe, in accordance with the present invention, consists of a body portion, having appropriate test probe contacts located on the bottom of the body, adapted to the extended into a chip carrier socket, having an appropriate configuration so as to be properly indexed into those sockets. The contacts of the test probe are connected to a cable which extends from the test probe itself to appropriate test equipment.

The body of the test probe is basically square in cross section so as to conform to the general shape of chip carrier socket geometry. In addition to having the appropriate corner configurations to provide appropriate indexing, a grabbing or grasping tong, of springlike material, is affixed to each of the sides of the test probe with a slip ring extending around the grabbing tongs. In operation, the test probe is inserted into the chip carrier socket and the grabbing tongs then engage the chip carrier socket edge, after which the slip ring is moved in a downward direction to move the grabbing tongs inward to move firmly create a mechanical connection to the chip carrier socket. In this way, both electrical and mechanical connections from the test equipment to the chip carrier socket are made facilitating the appropriate testing of associated circuitry terminating in the chip carrier socket.

An alternative version of the test probe, in accordance with the present invention, utilized for adaption where the chip carrier sockets are surface mounted, provides grabbing tongs mounted on the corners of the test probe and extending for a distance approriate to be grasped under the corners or outer edge of a surface mounted chip carrier socket.

DESCRIPTION OF THE PREFERRED EMBODIMENT

Figure 1:
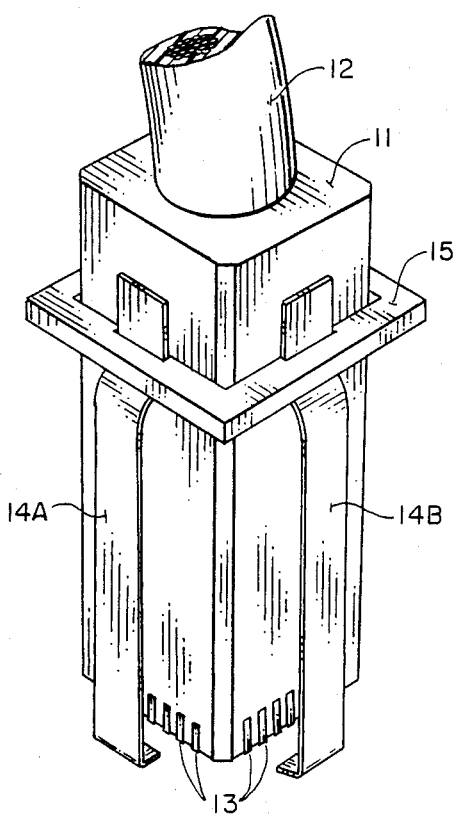
FIG. 1 is a perspective view of a chip carrier socket test probe in accordance with the present invention.

Referring first of FIG. 1, the chip carrier test probe of the present invention consists of a body portion 11, manufactured of electrically insulating material, to which is connected a cable 12, which would normally extend to test equipment. The cable terminates internally on probe contacts 13, which are located around the periphery of the bottom portion of the body of the test probe and adapted to engage peripheral contacts located in similar locations inside the chip carrier sockets to be tested.

Figure 2:
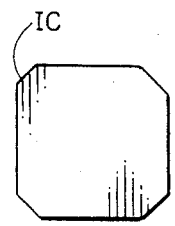
FIGS. 2 and 3 show the geometry of the opening of two forms of chip carrier sockets.
Figure 3:
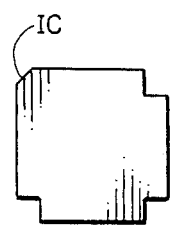
Figure 4:
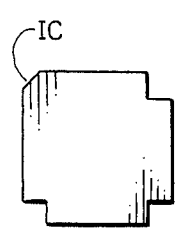
FIG. 4 shows a cross-sectional geometry of a test probe in accordance with the present invention.

The cross-sectional geometry of the test probe is like that shown in FIG. 4, which may be seen, is adapted to facilitate placement in chip carrier sockets having the geometry shown in FIG. 2 or in FIG. 3. The arrangement as shown will facilitate the test probe being inserted into any of the chip carrier socket geometrys, with the index corner IC, as seen in FIGS. 2, 3, and 4 all being identical, so proper orientation of the test probe into the chip carrier sockets will be guaranteed.

Secured to the outside, or periphery of the chip carrier probe, are four flat springlike insulated metal or plastic grabbing tongs 14A and 14B, (and 14C and 14D not shown). The ends of the tongs are formed inward at a 90 degree angle. A square shaped slip ring 15 encircles the test probe, including the grabbing tongs. The grabbing tongs have a formed radius near the top of the probe that prevents the slip ring from falling down around the probe. The probe configuration is suitable for use with through-hole mounted sockets that leave a slight gap between an associated printed wiring card and the underside of the chip carrier socket.

Figure 5:
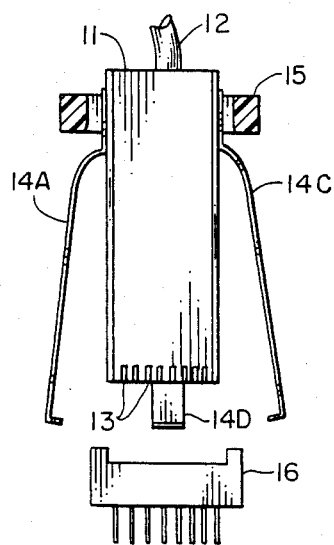
FIG. 5 is a cross-sectional side view of a test probe in accordance with the present invention positioned over a chip carrier socket.
Figure 6:
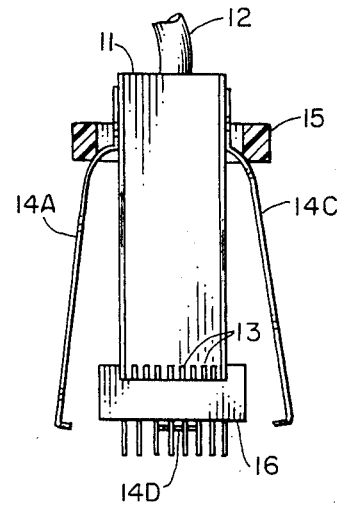
FIG. 6 is a cross-sectional side view of a chip carrier test probe in accordance with the present invention inserted into a chip carrier socket.
Figure 7:
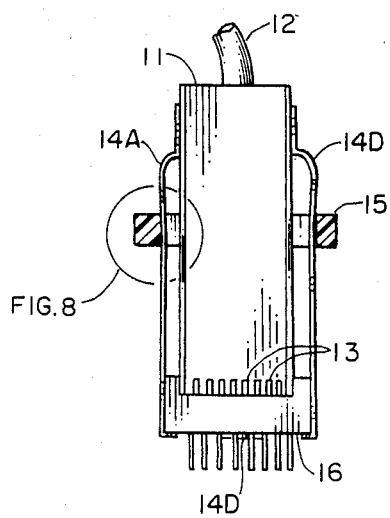
FIG. 7 is a cross-sectional side view of a chip carrier test probe in accordance with the present invention inserted into a chip carrier socket with the grabbing tongs that are a portion of the present invention grasping the chip carrier socket.
Figure 8:
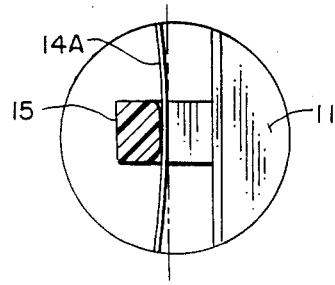
FIG. 8 is an enlarged sectional view of an associated slip ring positioned in contact with the grabbing tongs located on a test probe in accordance with the present invention.

Referring now to FIGS. 5, 6 and 7, the probe 11 is shown positioned initially over an associated chip carrier socket 16. In FIG. 6, the probe is inserted into the socket and in FIG. 7 the slip ring is moved in a downward direction around grabbing tongs 14A and 14C, grasping the under edge of chip carrier socket 16.

From the foregoing it will be obvious that the proper probe size and type is chosen to match the chip carrier input/output count and mounting style. The aforementioned operation is effective to force the tongs to move inward and grab the under side of the socket so that the probe is both electrically and mechanically fastened to the chip carrier socket to be tested. Reversing the above procedure is effective to remove the probe.

Figure 9:
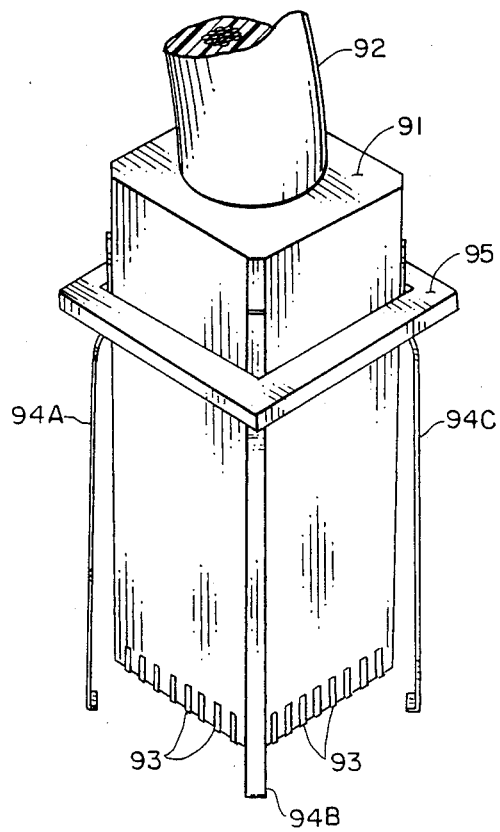
FIG. 9 is a perspective view of an alternative form of a chip carrier socket test probe adapted for utilization with surface mounted chip carrier sockets in accordance with the present invention.

Referring now to FIG. 9, the same probe configuration as described above, is employed except that the grabbing tongs 94A, 94B and 94C (94D not shown), are located at the four corners of the probe body 91. The probe will be both electrically and mechanically secured to the socket to be tested.

While only two embodiments of the present invention have been shown, it will be obvious to those skilled in the art that numerous modifications may be made without departing from the spirit of the present invention which shall be limited only by the scope of the claims appended hereto.

What is claimed is:

1. A test probe for use with a chip carrier socket comprising:
   a body portion, including a plurality of sides and first and second ends;
   said first end configured for insertion into and mating with said chip carrier socket;
   a plurality of electrical contacts located on said first end of said probe body portion;
   a plurality of electrical conductors each attached to at least one of said electrical contacts internally of said body portion and adapted to be connected to an associated electrical testing device;
   a plurality of socket engagement means each attached to said body for grasping said socket;
   a square shaped slip-ring device encircling said plurality of socket engagement-means, to apply equal pressure to all of said engagement means simultaneously when manually moved towards said probe first end;
   and indexing means comprising the cross-sectional geometry of said test probe body adapted to be aligned to correspond to indexing means included in said chip carrier socket;
   whereby in response to insertion into said socket, said probe body indexing means and corresponding indexing means included in said carrier socket ensure proper orientation of said probe in said socket, and in response to said engagement means grasping said socket, both electrical and mechanical connection is established between said probe and said chip carrier socket.

2. A test probe as claimed in claim 1 wherein:
said electrical conductors exit said probe at said second end.

3. A test probe as claimed in claim 1 wherein:
at least one of said socket engagement means is attached to each of said sides.

4. A test probe as claimed in claim 1 wherein:
at least one of said socket engagement means is attached to said probe at each junction of two of said sides.

5. A test probe as claimed in claim 1 wherein:
said socket engagement means are attached to said probe adjacent to said second end.

6. A test probe as claimed in claim 1 wherein:
said socket engagement means each extend beyond said first end.

7. A test probe as claimed in claim 1 wherein:
said socket engagement means are of resilient construction.

8. A test probe as claimed in claim 1 wherein:
said body portion is constructed of electrical insulating material.

* * * * *